United States Patent
Jiang et al.

(10) Patent No.: US 8,233,142 B2
(45) Date of Patent: Jul. 31, 2012

(54) MONITORING METHOD OF EXPOSURE APPARATUS

(75) Inventors: Da-Bai Jiang, Singapore (SG); Ching-Shu Lo, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 463 days.

(21) Appl. No.: 12/569,011

(22) Filed: Sep. 29, 2009

(65) Prior Publication Data

US 2011/0076601 A1    Mar. 31, 2011

(51) Int. Cl.
| | |
|---|---|
| G03B 27/32 | (2006.01) |
| G03B 27/68 | (2006.01) |
| G03B 27/42 | (2006.01) |
| G03B 27/52 | (2006.01) |
| G03B 27/54 | (2006.01) |
| G03B 27/58 | (2006.01) |

(52) U.S. Cl. ............... 355/77; 355/52; 355/53; 355/55; 355/67; 355/72

(58) Field of Classification Search ............... 355/52, 355/53, 55, 67–71, 72, 77; 430/5, 8, 22, 430/30, 311, 320, 322; 356/4.03, 601, 635, 356/636; 702/84; 700/121
See application file for complete search history.

(56) References Cited

U.S. PATENT DOCUMENTS

| | | | |
|---|---|---|---|
| 6,643,596 B2 * | 11/2003 | Firth et al. | 702/84 |
| 6,791,082 B2 * | 9/2004 | Komuro et al. | 250/307 |
| 6,869,807 B2 * | 3/2005 | Yoshitake et al. | 438/7 |
| 6,974,653 B2 | 12/2005 | Leung et al. | |
| 7,126,668 B2 | 10/2006 | Smith et al. | |
| 2002/0100012 A1 | 7/2002 | Sutani et al. | |
| 2003/0048458 A1 * | 3/2003 | Mieher et al. | 356/601 |
| 2004/0233445 A1 * | 11/2004 | Littau et al. | 356/401 |
| 2004/0267506 A1 * | 12/2004 | Bowley et al. | 702/189 |
| 2005/0168716 A1 * | 8/2005 | Ausschnitt | 355/55 |
| 2007/0154824 A1 * | 7/2007 | Sentoku et al. | 430/30 |
| 2009/0153818 A1 * | 6/2009 | Chauhan et al. | 355/53 |

* cited by examiner

*Primary Examiner* — Peter B Kim
*Assistant Examiner* — Christina Riddle
(74) *Attorney, Agent, or Firm* — WAPT, PC; Justin King

(57) ABSTRACT

In a monitoring method of an exposure apparatus, a top critical dimension (TCD) and a bottom critical dimension (BCD) of the test pattern formed on a photo-sensitive material layer are measured. A dose deviation ($\Delta E$) and a focus deviation ($\Delta F$) are calculated by following equations:

$$TCD+BCD = \alpha \Delta E + (TCD_0 + BCD_0)$$

$$TCD-BCD = \beta_1 \Delta F + \beta_2 \Delta F^3$$

Here, $\alpha$, $\beta_1$ and $\beta_2$ are constants, $\Delta E = E - E_0$, $\Delta F = F - F_0$, E represents a real exposure dose, F represents a real exposure focus, $E_0$ represents a dose defined when a middle critical dimension of the test pattern is equal to a predetermined value, $F_0$ represents a focus defined when TCD of the test pattern is equal to BCD thereof, and $TCD_0$ and $BCD_0$ are theoretical values in case of $E_0$ and $F_0$.

16 Claims, 2 Drawing Sheets

MONITORING METHOD OF EXPOSURE APPARATUS

BACKGROUND OF THE INVENTION

1. Field of the Invention

The present application relates to a monitoring method of an apparatus, and more particularly, to a monitoring method of an exposure apparatus.

2. Description of Related Art

A photolithography process is deemed as one of the most important processes in fabrication of semiconductors. Basic parameters affecting critical dimension (CD) in the photolithography process mainly include an exposure dose and a focus. Generally, during an exposure process performed on an exposure apparatus, there is a difference between a real exposure dose and a predetermined exposure dose and between a real focus and a predetermined focus, which are the so-called dose drift and focus drift, respectively. Thereby, the CD of patterns and profiles thereof are influenced. Hence, the exposure dose is frequently compensated according to the final measured CD after the exposure process is performed, and a predetermined exposure dose is provided by an exposure dose set-up system of the exposure apparatus, such that the CD of wafers in the next lot can be closer to a target value. Nonetheless, in the conventional compensation method, it is not likely to deduce the real exposure focus from the final measured CD, and therefore it is impossible to compensate the focus drift.

In light of the foregoing, error tolerance of device dimension is decreased along with the decrease in the device dimension. As such, at this current stage, manufacturers endeavor to accurately monitor and control the exposure dose and the exposure focus of the exposure apparatus for fabricating devices having acceptable critical dimension.

SUMMARY OF THE INVENTION

The present application is directed to a monitoring method of an exposure apparatus for determining whether an exposure dose drift and an exposure focus drift are existent in the exposure apparatus by calculating an exposure dose deviation and an exposure focus deviation of one single pattern.

The present application is further directed to a monitoring method of an exposure apparatus for determining whether an exposure dose drift and an exposure focus drift are existent in the exposure apparatus by calculating exposure dose deviations and exposure focus deviations of a plurality of patterns.

In the present application, a monitoring method of an exposure apparatus is provided. The monitoring method is adapted for determining whether there is a difference between a real exposure dose E and an input predetermined exposure dose $E_0$ and between a real exposure focus F and an input predetermined exposure focus $F_0$ in the exposure apparatus. In the monitoring method, a photo-sensitive material layer is first formed on a wafer. The wafer is then exposed with the input predetermined exposure dose $E_0$ and the input predetermined exposure focus $F_0$, and a mask pattern is transferred to the photo-sensitive material layer to form a test pattern. Next, a top critical dimension and a bottom critical dimension of the test pattern are measured to obtain a real top critical dimension TCD and a real bottom critical dimension BCD. Thereafter, an exposure dose deviation ($\Delta E$) and an exposure focus deviation ($\Delta F$) are calculated by following equations:

$$TCD+BCD=\alpha \Delta E+(TCD_0+BCD_0)$$

$$TCD-BCD=\beta_1 \Delta F+\beta_2 \Delta F^3$$

Here, $\alpha$, $\beta_1$, and $\beta_2$ are constants, $\Delta E=E-E_0$, $\Delta F=F-F_0$, E represents a real exposure dose, F represents a real exposure focus, $E_0$ represents a predetermined dose defined to make a middle critical dimension (MCD) of the test pattern equalize a target value, $F_0$ represents a predetermined focus defined to make the top critical dimension of the test pattern equalize the bottom critical dimension thereof, and $TCD_0$ and $BCD_0$ are theoretical top critical dimension and bottom critical dimension of the test pattern on a condition of exposing the wafer with the input predetermined exposure dose $E_0$ and the input predetermined exposure focus $F_0$, wherein $TCD_0$ is equal to $BCD_0$.

According to an exemplary embodiment of the present invention, a method of measuring the top critical dimension and the bottom critical dimension of the test pattern includes applying a critical dimension scanning electron microscope (CD-SEM) measurement.

According to an exemplary embodiment of the present invention, a method of measuring the top critical dimension and the bottom critical dimension of the test pattern includes applying a spectrum critical dimension (SCD) measurement.

According to an exemplary embodiment of the present invention, when the exposure dose deviation $\Delta E$ is greater than a predetermined range, the monitoring method further includes a step of manually adjusting the exposure apparatus to be in a baseline state.

According to an exemplary embodiment of the present invention, when the exposure focus deviation $\Delta F$ is greater than a predetermined range, the monitoring method further includes a step of manually adjusting the exposure apparatus to be in a baseline state.

According to an exemplary embodiment of the present invention, the exposure apparatus is connected to a process control system, and the process control system automatically feeds back to the exposure apparatus according to the exposure dose deviation $\Delta E$ and the exposure focus deviation $\Delta F$.

According to an exemplary embodiment of the present invention, the process control system further automatically feeds back to the exposure apparatus according to a thickness of the photo-sensitive material layer.

According to an exemplary embodiment of the present invention, the process control system includes an advanced process control (APC) system.

In the present application, a monitoring method of another exposure apparatus is also provided. In the monitoring method, a photo-sensitive material layer is first formed on a wafer. The wafer is then exposed with an input predetermined exposure dose $E_0$ and an input predetermined exposure focus $F_0$, and mask patterns with different duty ratios are transferred to the photo-sensitive material layer to form a plurality of test patterns. Next, a top critical dimension and a bottom critical dimension of each of the test patterns are measured to obtain a real top critical dimension TCD and a real bottom critical dimension BCD of each of the test patterns. Thereafter, an exposure dose deviation $\Delta E$ and an exposure focus deviation $\Delta F$ corresponding to each of the test patterns are calculated by following equations:

$$TCD+BCD=\alpha \Delta E+(TCD_0+BCD_0)$$

$$TCD-BCD=\beta_1 \Delta F+\beta_2 \Delta F^3$$

Here, $\alpha$, $\beta_1$, $\beta_2$ are constants, $\Delta E=E-E_0$, $\Delta F=F-F_0$, E represents a real exposure dose, F represents a real exposure focus, $E_0$ represents a predetermined dose defined to make a middle critical dimension of each of the test patterns equalize its corresponding target value, $F_0$ represents a predetermined focus defined to make the top critical dimension of each of the test patterns equalize the bottom critical dimension thereof, and $TCD_0$ and $BCD_0$ are theoretical top critical dimension and bottom critical dimension of each of the test patterns on a condition of exposing the wafer with the input predetermined exposure dose $E_0$ and the input predetermined exposure focus $F_0$, wherein $TCD_0$ is equal to $BCD_0$. After that, deviation directions of the exposure dose deviations $\Delta E$ are compared to determine whether the deviation directions of the exposure dose deviations $\Delta E$ are consistent, and deviation directions of the exposure focus deviations $\Delta F$ are compared to determine whether the deviation directions of the exposure focus deviations $\Delta F$ are consistent.

According to an exemplary embodiment of the present invention, a method of measuring the top critical dimension and the bottom critical dimension of each of the test patterns includes applying a CD-SEM measurement.

According to an exemplary embodiment of the present invention, a method of measuring the top critical dimension and the bottom critical dimension of each of the test patterns includes applying an SCD measurement.

According to an exemplary embodiment of the present invention, when the deviation directions of the exposure dose deviations $\Delta E$ are inconsistent or when the deviation directions of the exposure focus deviations $\Delta F$ are inconsistent, the monitoring method further includes a step of checking a hardware device in the exposure apparatus.

According to an exemplary embodiment of the present invention, the hardware device includes a lens.

According to an exemplary embodiment of the present invention, the exposure apparatus is connected to a process control system. The process control system automatically feeds back to the exposure apparatus according to the exposure dose deviations $\Delta E$ and the exposure focus deviations $\Delta F$ when the deviation directions of the exposure dose deviations $\Delta E$ are consistent and when the deviation directions of the exposure focus deviations $\Delta F$ are consistent.

According to an exemplary embodiment of the present invention, the process control system further automatically feeds back to the exposure apparatus according to a thickness of the photo-sensitive material layer.

According to an exemplary embodiment of the present invention, the process control system includes an APC system.

Based on the above, the monitoring method of the exposure apparatus in the present application is conducted by calculating the exposure dose deviation and the exposure focus deviation of the exposure apparatus so as to determine whether the exposure dose and the exposure focus of the exposure apparatus are deviated from the baseline. Thereby, the exposure apparatus can be ensured to be in a stable and favorable exposure state.

In order to make the aforementioned and other features and advantages of the present invention more comprehensible, several embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

Figure 1:
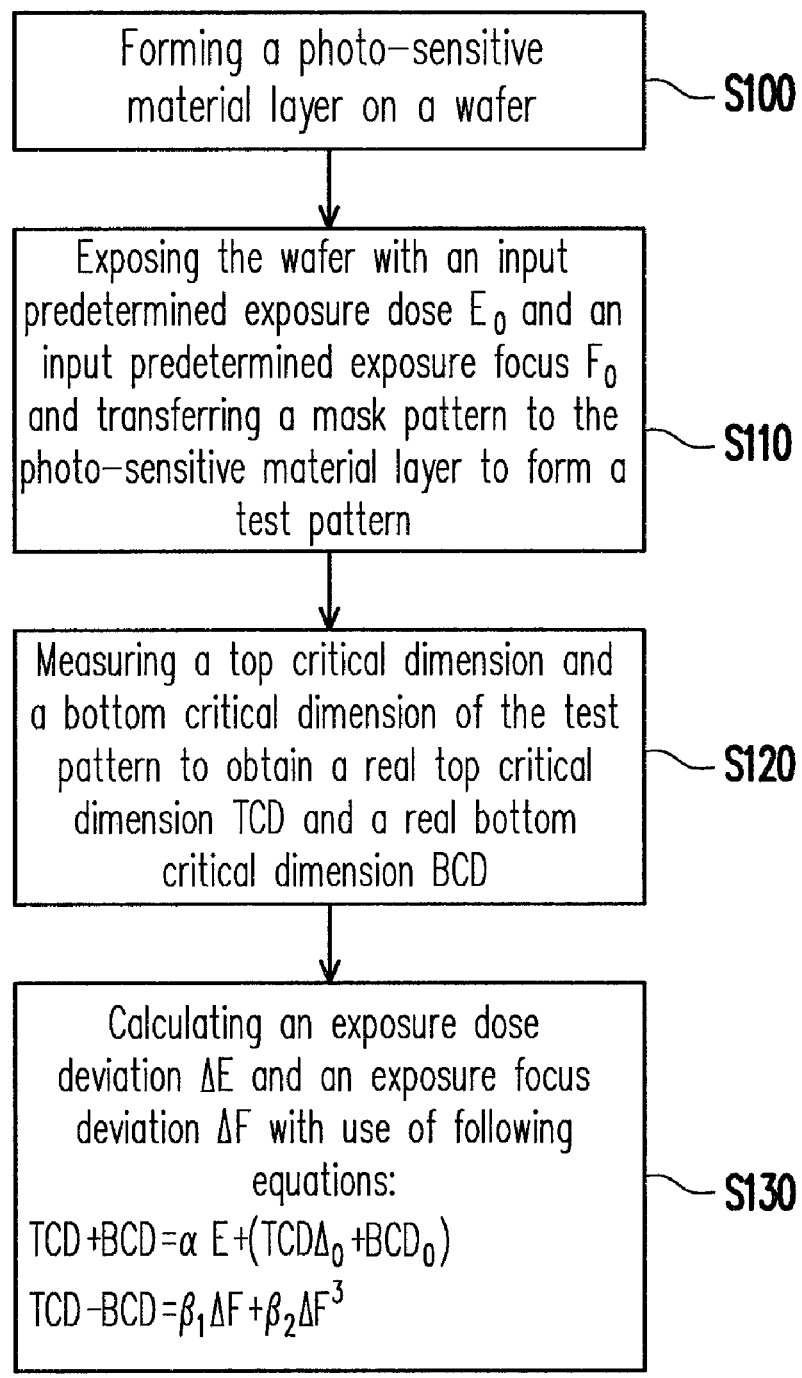
FIG. 1 is a schematic flow chart illustrating a monitoring method of an exposure apparatus according to a first embodiment of the present invention.

With increasing development of semiconductor manufacturing processes, error tolerance of device dimension is decreased little by little. Thereby, the difference between the real exposure dose and the predetermined exposure dose and the difference between the real exposure focus and the predetermined exposure focus severely deteriorate accuracy of the CD of the final exposure patterns. As such, a monitoring method of an exposure apparatus is provided in the present application. Based on an exposure dose deviation and an exposure focus deviation calculated by equations, it is likely to determine whether the exposure dose and the exposure focus of the exposure apparatus are deviated from the baseline. Besides, the exposure dose and the exposure focus can be compensated to ensure the exposure apparatus can be in a stable and favorable exposure state.

In detail, after a long-term use, the status of the exposure apparatus is changed because of internal or external condition, thereby resulting in a difference between the real exposure dose and a predetermined exposure dose $E_0$ and a difference between the real exposure focus and a predetermined exposure focus $F_0$. According to the present invention, equations are utilized to calculate said differences for monitoring the exposure apparatus. Therefore, prior to discussion on how to apply the equations, it is necessary to describe the way to define the predetermined exposure dose $E_0$ and the predetermined exposure focus $F_0$. Generally, by way of a focus-energy matrix (FEM), test masks having patterns with different duty ratios are employed to expose a photo-sensitive material layer on a wafer, such that test patterns are formed on the photo-sensitive layer. A top critical dimension (TCD), a middle critical dimension (MCD), and a bottom critical dimension (BCD) of each of the test patterns are then measured. Here, the MCD of one of the test patterns is equal to a target value on the condition that a certain exposure dose is provided, and the certain exposure dose is referred to as the predetermined exposure dose $E_0$. Similarly, the TCD of one of the test patterns is equal to the BCD on the condition that a certain exposure focus is provided, and the certain exposure focus is referred to as the predetermined exposure focus $F_0$. The test pattern exposed by the predetermined exposure doses $E_0$ and the predetermined exposure focuses $F_0$ has a top critical dimensions $TCD_0$ and a bottom critical dimensions $BCD_0$. The TCD of the test patterns is equal to the BCD thereof on the condition as the predetermined exposure focus $F_0$ is provided, thus $TCD_0$ is equal to $BCD_0$. Then, the predetermined exposure doses $E_0$ and the predetermined exposure focus $F_0$ are used as central condition of the FEM, and $TCD_0$ and $BCD_0$ of each of the test patterns are measured on the condition as the different focus and energy are provided. The resulting values are substituted into the following equations to obtain $\alpha$, $\beta_1$ and $\beta_2$ by numerical regression method.

$$TCD+BCD=\alpha \Delta E+(TCD_0+BCD_0)$$

$$TCD-BCD=\beta_1 \Delta F+\beta_2 \Delta F^3$$

The monitoring method of the exposure apparatus applying the equations of the present invention is described below.

[First Embodiment]

FIG. 1 is a schematic flow chart illustrating a monitoring method of an exposure apparatus according to a first embodiment of the present invention. In the present embodiment, a real exposure dose E and a real exposure focus F are compared to the predetermined exposure dose $E_0$ and the predetermined exposure focus $F_0$ determined as mentioned above on the condition that other exposure parameters are the same.

First, in step S100 of the monitoring method, a photo-sensitive material layer is formed on a wafer.

In step S110, the wafer is then exposed with the input predetermined exposure dose $E_0$ and the input predetermined exposure focus $F_0$, and one mask pattern is transferred to the photo-sensitive material layer to form a test pattern. It is noted that one mask pattern described herein is referred to one of a plurality of repeating patterns having the same duty ratio, thus the test pattern formed on the photo-sensitive material layer is substantially referred to one of a plurality of repeating patterns.

Next, in step S120, a top critical dimension and a bottom critical dimension of the test pattern are measured to obtain a real top critical dimension TCD and a real bottom critical dimension BCD. According to the present embodiment, a method of measuring the top critical dimension and the bottom critical dimension of the test pattern includes applying a CD-SEM measurement, an SCD measurement, and other appropriate measurements.

After that, in step S130, the real top critical dimension TCD, the real bottom critical dimension BCD, the aforesaid top critical dimension $TCD_0$, and the aforesaid bottom critical dimension $BCD_0$ are substituted into the following equations to obtain the exposure dose deviation $\Delta E$ and the exposure focus deviation $\Delta F$:

$$TCD+BCD=\alpha\Delta E+(TCD_0+BCD_0)$$

$$TCD-BCD=\beta_1\Delta F+\beta_2\Delta F^3$$

Here, $\alpha$, $\beta_1$, and $\beta_2$ are constants, $\Delta E=E-E_0$, $\Delta F=F-F_0$, E represents a real exposure dose, F represents a real exposure focus, $E_0$ represents a predetermined dose defined to make a middle critical dimension of the test pattern equalize a target value, $F_0$ represents a predetermined focus defined to make the top critical dimension of the test pattern equalize the bottom critical dimension thereof, and $TCD_0$ and $BCD_0$ are the theoretical top critical dimension and the theoretical bottom critical dimension of the test pattern on a condition of exposing the wafer with the input predetermined exposure dose $E_0$ and the input predetermined exposure focus $F_0$, wherein $TCD_0$ is equal to $BCD_0$.

It is noted that the test pattern formed on the photo-sensitive material layer is substantially referred to one of a plurality of repeating patterns as mentioned before. Therefore, in the present embodiment, a plurality of the TCD, BCD, $TCD_0$, and $BCD_0$ of the repeating patterns are obtained, and a plurality of the $\Delta E$ and $\Delta F$ are obtained by the equations. Accordingly, the exposure dose deviation $\Delta E$ and the exposure focus deviation $\Delta F$ in the present embodiment are respectively referred to the mean value of a plurality of the exposure dose deviation $\Delta E$ and the mean value of a plurality of the exposure focus deviation $\Delta F$.

According to the exposure dose deviation $\Delta E$ and the exposure focus deviation $\Delta F$, it is likely to determine whether the exposure dose and the exposure focus of the exposure apparatus are deviated from the baseline. Besides, the real exposure dose and the real exposure focus can both be obtained. In the present embodiment, the exposure apparatus is connected to a process control system, for example. Hence, the process control system automatically feeds back to the exposure apparatus according to the exposure dose deviation $\Delta E$ and the exposure focus deviation $\Delta F$. It should be mentioned that other exposure parameters are identical to the other exposure parameters on which the predetermined exposure dose $E_0$ and the predetermined exposure focus $F_0$ are defined according to the present embodiment. In another embodiment, however, given that other process conditions are changed, such as a changed thickness of the photo-sensitive material layer or other changed parameters, the process control system automatically feeds backs to the exposure apparatus based on the changed process conditions as well as the exposure dose deviation PE and the exposure focus deviation $\Delta F$. Here, the process control system is, for example, an advanced process control (APC) system.

Additionally, in an embodiment, when the exposure dose deviation $\Delta E$ is greater than a predetermined range or when the exposure focus deviation $\Delta F$ is greater than a predetermined range, the exposure apparatus is manually adjusted to be back to a baseline state.

As discussed in the present embodiment, the exposure dose deviation $\Delta E$ and the exposure focus deviation $\Delta F$ of the exposure apparatus are calculated to monitor the exposure apparatus and determine whether the exposure dose drift and the exposure focus drift occur in the exposure apparatus. Thereby, whether, the exposure dose and the exposure focus of the exposure apparatus are deviated from the baseline can be monitored, and the exposure dose and the exposure focus can be compensated to stabilize and optimize the exposure state of the exposure apparatus. Thus, devices having acceptable critical dimension can be manufactured, such that manufacturing yield is significantly improved while the manufacturing costs are reduced to a great extent.

In the first embodiment, the exposure dose deviation $\Delta E$ and the exposure focus deviation $\Delta F$ is calculated according to TCD and BCD of single test pattern to monitor the exposure apparatus, while a monitoring method of an exposure apparatus in which exposure dose deviations $\Delta E$ and exposure focus deviations $\Delta F$ are calculated according to TCDs and BCDs of a plurality of test patterns is described hereinafter.

[Second Embodiment]

Figure 2:
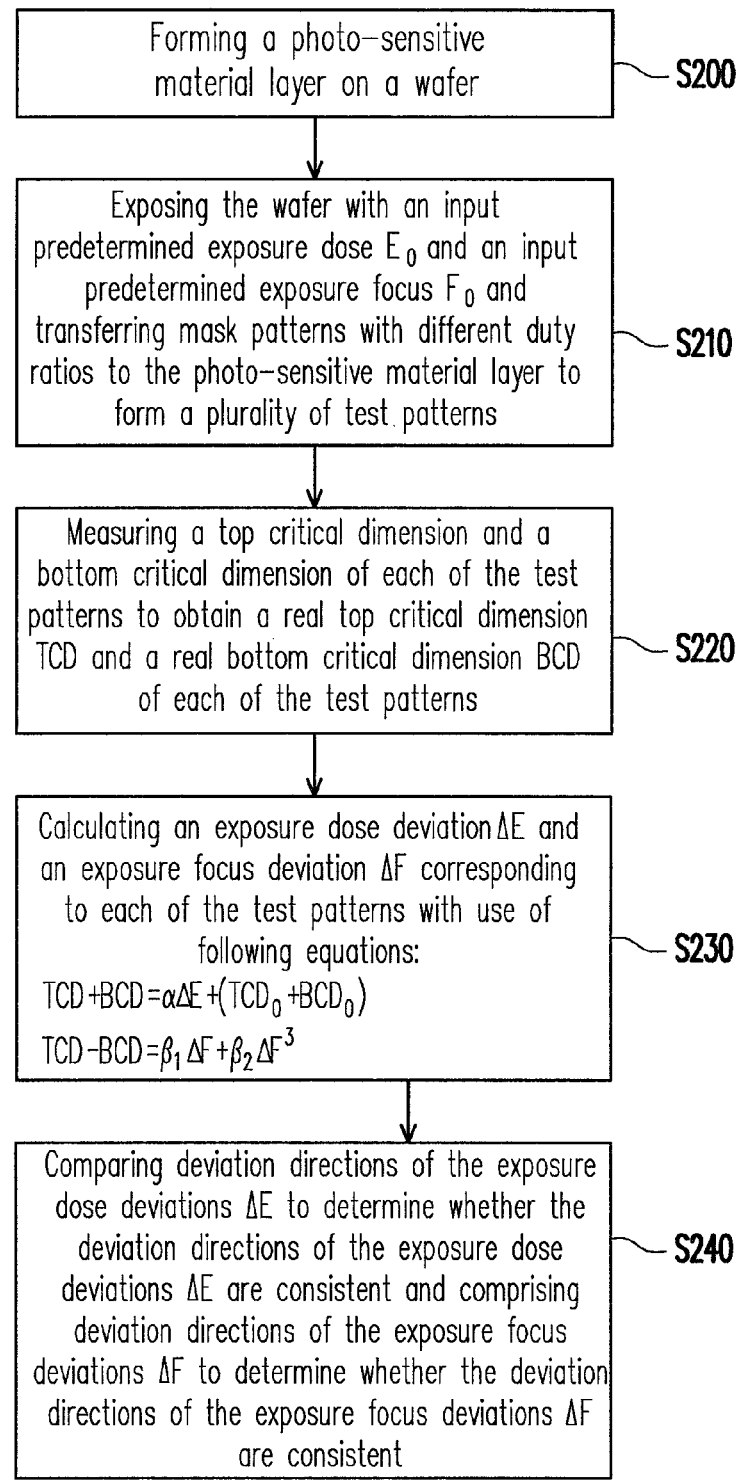
FIG. 2 is a schematic flow chart illustrating a monitoring method of an exposure apparatus according to a second embodiment of the present invention.

FIG. 2 is a schematic flow chart illustrating a monitoring method of an exposure apparatus according to a second embodiment of the present invention. In the present embodiment, a real exposure dose E and a real exposure focus F are compared to the predetermined exposure dose $E_0$ and the predetermined exposure focus $F_0$ determined as mentioned above on the condition that other exposure parameters are the same.

In step S200 of the monitoring method, first, a photo-sensitive material layer is formed on a wafer.

In step S210, the wafer is then exposed with an input predetermined exposure dose $E_0$ and an input predetermined exposure focus $F_0$, and mask patterns with different duty ratios are transferred to the photo-sensitive material layer to form a plurality of test patterns P1 and P2. According to the present embodiment, the first test pattern P1 and the second test pattern P2 having different duty ratios are formed on the photo-sensitive material layer, for example. In another embodiment, however, the number of the test patterns having different duty ratios formed on the photo-sensitive material layer can be adjusted.

Next, in step S220, a top critical dimension and a bottom critical dimension of each of the test patterns P1 and P2 are measured to obtain real top critical dimensions $TCD_1$ and $TCD_2$ and real bottom critical dimensions $BCD_1$ and $BCD_2$ of the test patterns P1 and P2. Specifically, $TCD_1$ and $BCD_1$ respectively refer to the real top critical dimension and the real bottom critical dimension of the first test pattern P1, while $TCD_2$ and $BCD_2$ respectively refer to the real top critical dimension and the real bottom critical dimension of the second test pattern P2. The measurement of the CDs is described in the first embodiment and will not be further elaborated herein.

Afterward, in step S230, the real top critical dimensions $TCD_1$ and $TCD_2$ and the real bottom critical dimensions $BCD_1$ and $BCD_2$ of the test patterns P1 and P2 are substituted into the following equations in form of TCD and BCD so as to obtain the exposure dose deviations $\Delta E_1$ and $\Delta E_2$ and the exposure focus deviations $\Delta F_1$ and $\Delta F_2$ corresponding to the test patterns P1 and P2:

$$TCD+BCD=\alpha \Delta E+(TCD_0+BCD_0)$$

$$TCD-BCD=\beta_1 \Delta F+\beta_2 \Delta F^3$$

Here, $\alpha$, $\beta_1$, and $\beta_2$ are constants, $\Delta E=E-E_0$, $\Delta F=F-F_0$, E represents a real exposure dose, F represents a real exposure focus, $E_0$ represents a predetermined dose defined to make a middle critical dimension of each of the test patterns P1 and P2 equalize its corresponding target value, $F_0$ represents a predetermined focus defined to make the top critical dimension of each of the test patterns P1 and P2 equalize the bottom critical dimension thereof, and $TCD_0$ and $BCD_0$ are theoretical top critical dimension and bottom critical dimension of each of the test patterns P1 and P2 on a condition of exposing the wafer with the input predetermined exposure dose $E_0$ and the input predetermined exposure focus $F_0$, wherein $TCD_0$ is equal to $BCD_0$. It can be realized that the test patterns P1 and P2 respectively have individual top and bottom critical dimensions $TCD_0$ and $BCD_0$.

Thereafter, in step S240, deviation directions of the exposure dose deviations $\Delta E_1$ and $\Delta E_2$ are compared to determine whether the deviation directions of the exposure dose deviations $\Delta E_1$ and $\Delta E_2$ are consistent, and deviation directions of the exposure focus deviations $\Delta F_1$ and $\Delta F_2$ are compared to determine whether the deviation directions of the exposure focus deviations $\Delta F_1$ and $\Delta F_2$ are consistent. In the present embodiment, the deviation directions of the exposure dose deviations $\Delta E_1$ and $\Delta E_2$ are the same, e.g., positive or negative deviation directions, and the deviation directions of the exposure focus deviations $\Delta F_1$ and $\Delta F_2$ are the same, e.g., positive or negative deviation directions. Thereby, a process control system connected to the exposure apparatus can automatically feed back to the exposure apparatus based on the exposure dose deviations $\Delta E_1$ and $\Delta E_2$ and the exposure focus deviations $\Delta F_1$ and $\Delta F_2$. Usually, when the exposure dose deviations $\Delta E_1$ and $\Delta E_2$ are different, the automatic feedback mentioned before is performed by using the mean value of the exposure dose deviations $\Delta E_1$ and $\Delta E_2$. Similarly, when the exposure focus deviations $\Delta F_1$ and $\Delta F_2$ are different, the automatic feedback mentioned before is performed by using the mean value of the exposure focus deviations $\Delta F_1$ and $\Delta F_2$. Moreover, as described in the first embodiment, the process control system can also automatically feed back to the exposure apparatus further based on other varied process conditions, e.g., a changed thickness of the photo-sensitive material layer.

Nevertheless, in another embodiment, when the deviation directions of the exposure dose deviations $\Delta E_1$ and $\Delta E_2$ are inconsistent or when the deviation directions of the exposure focus deviations $\Delta F_1$ and $\Delta F_2$ are inconsistent, the monitoring method further includes a step of checking a hardware device in the exposure apparatus. For instance, if the deviation directions of the exposure focus deviations $\Delta F_1$ and $\Delta F_2$ are inconsistent, an inspection can be conducted to determine whether a lens is abnormal or not.

As discussed in the present embodiment, the exposure dose deviations $\Delta E$ and the exposure focus deviations $\Delta F$ of the exposure apparatus are calculated to determine whether the exposure dose drift and the exposure focus drift occur in the exposure apparatus. Thereby, whether the exposure dose and the exposure focus of the exposure apparatus are deviated from the baseline can be monitored, and the exposure dose and the exposure focus can be compensated to stabilize and optimize the exposure state of the exposure apparatus. In addition, by means of the exposure dose deviations $\Delta E$ and the exposure focus deviations $\Delta F$, whether stable and normal operation is performed on the exposure apparatus and its hardware device can be determined.

To sum up, the difference between the real exposure dose and the predetermined exposure dose and the difference between the real exposure focus and the predetermined exposure focus can be detected by applying the monitoring method of the exposure apparatus in the present application so as to determine whether the exposure dose drift and the exposure focus drift occur in the exposure apparatus. Thereby, whether the exposure dose and the exposure focus of the exposure apparatus are deviated from the baseline can be monitored, and the exposure dose and the exposure focus can be compensated to stabilize and optimize the exposure state of the exposure apparatus. Thus, devices having acceptable critical dimension can b manufactured, such that manufacturing yield is significantly improved while the manufacturing costs are reduced to a great extent.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A monitoring method of an exposure apparatus, the monitoring method being adapted for determining whether there is a difference between a real exposure dose E and an input predetermined exposure dose $E_0$ and between a real exposure focus F and an input predetermined exposure focus $F_0$, the monitoring method comprising:

forming a photo-sensitive material layer on a wafer;

exposing the wafer with the input predetermined exposure dose $E_0$ and the input predetermined exposure focus $F_0$ and transferring a mask pattern to the photo-sensitive material layer to form a test pattern;

measuring a top critical dimension and a bottom critical dimension of the test pattern to obtain a real top critical dimension TCD and a real bottom critical dimension BCD; and calculating an exposure dose deviation $\Delta E$ and an exposure focus deviation $\Delta F$ with use of the following equations:

$$TCD+BCD=\alpha \Delta E+(TCD_0+BCD_O)$$

$$TCD-BCD=\beta_1 \Delta F+\beta_2 \Delta F^3,$$

wherein $\alpha$, $\beta_1$, and $\beta_2$ are constants, $\Delta E=E-E_0$, $\Delta F=F-F_0$, E represents a real exposure dose, F represents a real exposure focus, $E_0$ represents a predetermined dose defined to make a middle critical dimension of the test pattern equalize a target value, $F_0$ represents a predetermined focus defined to make the top critical dimension of the test pattern equalize the bottom critical dimension thereof, and $TCD_0$ and $BCD_0$ are theoretical top critical dimension and bottom critical dimension of the test pattern on a condition of exposing the wafer with the input predetermined exposure dose $E_0$ and the input predetermined exposure focus $F_0$, wherein $TCD_0$ is equal to $BCD_0$.

2. The monitoring method of the exposure apparatus as claimed in claim 1, wherein a method of measuring the top critical dimension and the bottom critical dimension of the test pattern comprises applying a critical dimension scanning electron microscope measurement.

3. The monitoring method of the exposure apparatus as claimed in claim 1, wherein a method of measuring the top critical dimension and the bottom critical dimension of the test pattern comprises applying a spectrum critical dimension measurement.

4. The monitoring method of the exposure apparatus as claimed in claim 1, further comprising manually adjusting the exposure apparatus to a baseline state when the exposure dose deviation $\Delta E$ is greater than a predetermined range.

5. The monitoring method of the exposure apparatus as claimed in claim 1, further comprising manually adjusting the exposure apparatus to a baseline state when the exposure focus deviation $\Delta F$ is greater than a predetermined range.

6. The monitoring method of the exposure apparatus as claimed in claim 1, wherein the exposure apparatus is connected to a process control system, and the process control system automatically feeds back to the exposure apparatus according to the exposure dose deviation $\Delta E$ and the exposure focus deviation $\Delta F$.

7. The monitoring method of the exposure apparatus as claimed in claim 6, wherein the process control system further automatically feeds back to the exposure apparatus according to a thickness of the photo-sensitive material layer.

8. The monitoring method of the exposure apparatus as claimed in claim 6, wherein the process control system comprises an advanced process control system.

9. A monitoring method of an exposure apparatus, comprising:

forming a photo-sensitive material layer on a wafer;

exposing the wafer with an input predetermined exposure dose $E_0$ and an input predetermined exposure focus $F_0$ and transferring mask patterns with different duty ratios to the photo-sensitive material layer to form a plurality of test patterns;

measuring a top critical dimension and a bottom critical dimension of each of the test patterns to obtain a real top critical dimension TCD and a real bottom critical dimension BCD of each of the test patterns; and calculating an exposure dose deviation $\Delta E$ and an exposure focus deviation $\Delta F$ corresponding to each of the test patterns by the following equations:

$$TCD+BCD=\alpha \Delta E+(TCD_0+BCD_0)$$

$$TCD-BCD=\beta_1 \Delta F+\beta_2 \Delta F^3,$$

wherein $\alpha$, $\beta_1$, and $\beta_2$ are constants, $\Delta E = E - E_0$, $\Delta F = F - F_0$, E represents a real exposure dose, F represents a real exposure focus, $E_0$ represents a predetermined dose defined to make a middle critical dimension of each of the test patterns equalize its corresponding target value, $F_0$ represents a predetermined focus defined to make the top critical dimension of each of the test patterns equalize the bottom critical dimension thereof, and $TCD_0$ and $BCD_0$ are theoretical top critical dimension and bottom critical dimension of each of the test patterns on a condition of exposing the wafer with the input predetermined exposure dose $E_0$ and the input predetermined exposure focus $F_0$, wherein $TCD_0$ is equal to $BCD_0$; and comparing deviation directions of the exposure dose deviations $\Delta E$ to determine whether the deviation directions of the exposure dose deviations $\Delta E$ are consistent and comparing deviation directions of the exposure focus deviations $\Delta F$ to determine whether the deviation directions of the exposure focus deviations $\Delta F$ are consistent.

10. The monitoring method of the exposure apparatus as claimed in claim 9, wherein a method of measuring the top critical dimension and the bottom critical dimension of each of the test patterns comprises applying a critical dimension scanning electron microscope measurement.

11. The monitoring method of the exposure apparatus as claimed in claim 9, wherein a method of measuring the top critical dimension and the bottom critical dimension of each of the test patterns comprises applying a spectrum critical dimension measurement.

12. The monitoring method of the exposure apparatus as claimed in claim 9, further comprising checking a hardware device in the exposure apparatus when the deviation directions of the exposure dose deviations $\Delta E$ are inconsistent or when the deviation directions of the exposure focus deviations $\Delta F$ are inconsistent.

13. The monitoring method of the exposure apparatus as claimed in claim 12, wherein the hardware device comprises a lens.

14. The monitoring method of the exposure apparatus as claimed in claim 9, wherein the exposure apparatus is connected to a process control system, and the process control system automatically feeds back to the exposure apparatus according to the exposure dose deviations $\Delta E$ and the exposure focus deviations $\Delta F$ when the deviation directions of the exposure dose deviations $\Delta E$ are consistent and when the deviation directions of the exposure focus deviations $\Delta F$ are consistent.

15. The monitoring method of the exposure apparatus as claimed in claim 14, wherein the process control system further automatically feeds back to the exposure apparatus according to a thickness of the photo-sensitive material layer.

16. The monitoring method of the exposure apparatus as claimed in claim 14, wherein the process control system comprises an advanced process control system.

* * * * *